(12) United States Patent
Onose (10) Patent No.: US 11,360,454 B2
(45) Date of Patent: *Jun. 14, 2022

(54) LADDER DISPLAY DEVICE FOR CIRCUIT GENERATION USING TOUCH PANEL

(71) Applicant: Fanuc Corporation, Yamanashi (JP)

(72) Inventor: Nao Onose, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 117 days.

This patent is subject to a terminal disclaimer.

(21) Appl. No.: 16/811,166

(22) Filed: Mar. 6, 2020

(65) Prior Publication Data

US 2020/0310377 A1 Oct. 1, 2020

(30) Foreign Application Priority Data

Apr. 1, 2019 (JP) .............................. JP2019-070168

(51) Int. Cl.
  G05B 19/05 (2006.01)
  G06F 8/34 (2018.01)
  (Continued)

(52) U.S. Cl.
  CPC ....... G05B 19/056 (2013.01); G06F 3/04817 (2013.01); G06F 3/04842 (2013.01);
  (Continued)

(58) Field of Classification Search
  CPC .................................. G06F 30/31; G06F 8/34
  (Continued)

(56) References Cited

U.S. PATENT DOCUMENTS

| 2011/0295388 A1* | 12/2011 | Iwata | G05B 19/056 |
| | | | 700/18 |
| 2014/0229911 A1 | 8/2014 | Inamoto | |

(Continued)

FOREIGN PATENT DOCUMENTS

| JP | 2002229613 A | 8/2002 |
| JP | 2016148887 A | 8/2016 |

(Continued)

OTHER PUBLICATIONS

Japanese Decision to Grant a Patent for Japanese Application No. 2019-070168, dated Jan. 4, 2022, with translation, 5 pages.

*Primary Examiner* — Md Azad
(74) *Attorney, Agent, or Firm* — RatnerPrestia

(57) ABSTRACT

A ladder display device of the disclosure includes: a ladder circuit storage unit that stores an insertion condition including at least an operation start position of a gesture operation, an operation end position of the gesture operation, and a circuit state of a net on a ladder diagram related to the gesture operation as insertion target ladder circuit information in association with a ladder circuit that is an insertion target; a ladder circuit condition determination unit that, with reference to the ladder circuit storage unit, determines a ladder circuit whose insertion condition is satisfied by a gesture operation performed on the touch panel; a ladder circuit generation unit that generates a ladder circuit determined by the ladder circuit condition determination unit as the gesture operation satisfying an insertion condition; and an edition control unit that inserts a ladder circuit generated by the ladder circuit generation unit into the ladder program.

4 Claims, 10 Drawing Sheets

GESTURE OPERATION

INSERT SELF-HOLDING CIRCUIT (51) Int. Cl.
  *G06F 3/04817* (2022.01)
  *G06F 3/04883* (2022.01)
  *G06F 3/04842* (2022.01)
  *G06F 30/343* (2020.01)
  *G06F 30/31* (2020.01)
(52) U.S. Cl.
  CPC ............ *G06F 3/04883* (2013.01); *G06F 8/34* (2013.01); *G06F 30/31* (2020.01); *G06F 30/343* (2020.01); *G05B 2219/13031* (2013.01); *G05B 2219/13128* (2013.01); *G05B 2219/13144* (2013.01); *G05B 2219/13145* (2013.01)
(58) Field of Classification Search
  USPC .......................................................... 700/18
  See application file for complete search history.

(56) References Cited

U.S. PATENT DOCUMENTS

| | | | |
|---|---|---|---|
| 2015/0094829 A1* | 4/2015 | Iwatsu | G06K 9/80 700/86 |
| 2016/0179904 A1* | 6/2016 | Mochizuki | H03K 19/17764 707/722 |
| 2016/0196118 A1 | 7/2016 | Udou | |
| 2017/0083017 A1* | 3/2017 | Ino | G05B 19/406 |
| 2017/0212798 A1* | 7/2017 | Satou | G06F 11/3471 |

FOREIGN PATENT DOCUMENTS

| | | |
|---|---|---|
| WO | 2013038541 A1 | 3/2013 |
| WO | 2013073023 A1 | 5/2013 |
| WO | 2015025382 A1 | 2/2015 |

\* cited by examiner

| Operation type | Insertion condition of ladder circuit | | | | Insertion target ladder circuit |
|---|---|---|---|---|---|
| | Operation start position | Operation end position | Ladder circuit state | Operation direction | |
| Slide operation | · Coil (with address) | Near node present on same net as operation start position | Node ≧ 1<br>Coil (with address) ≧ 1 | — | Self-holding circuit<br>(Set address of coil at operation start position for node) |
| Slide operation | · Coil (with address) | Near node present on different net from operation start position | [Operation start position]<br>Coil (with address) ≧ 1<br>[Operation end position]<br>Coil (with address) ≧ 1 | Upward direction | Interlock circuit<br>(Set address of coil at operation start position for negative form node) |
| Slide operation | · Coil (with address) | Near node present on different net from operation start position | [Operation start position]<br>Coil (with address) ≧ 1<br>[Operation end position]<br>Coil (with address) ≧ 1 | Downward direction | AND circuit<br>(Set address of coil at operation start position for node) |
| Two-point touch slide operation | · First coil (with address)<br>· Second coil (with address) present on net different from net on which first coil is present | Near start point on net different from operation start position (first coil) | [Operation start position]<br>First coil (with address) ≧ 1<br>Second coil (with address) | — | Flip-flop circuit<br>(Set addresses of first coil and second coil for respective nodes) |
| ⋮ | ⋮ | ⋮ | ⋮ | ⋮ | ⋮ |

FIG.4

GESTURE OPERATION

INSERT SELF-HOLDING CIRCUIT

FIG.5

INSERTION SELF-HOLDING CIRCUIT FAILED

GESTURE OPERATION

FIG.6

INSERT INTERLOCK CIRCUIT

GESTURE OPERATION

FIG.7

INSERT FLIP-FLOP CIRCUIT

GESTURE OPERATION

INSERT USER DEFINITION CIRCUIT (INVERTING CIRCUIT)

GESTURE OPERATION

LADDER DISPLAY DEVICE FOR CIRCUIT GENERATION USING TOUCH PANEL

RELATED APPLICATIONS

The present application claims priority to Japanese Patent Application Number 2019-070168 filed Apr. 1, 2019, the disclosure of which is hereby incorporated by reference herein in its entirety.

BACKGROUND OF THE INVENTION

1. Field of the Invention

The present disclosure relates to a ladder display device, in particular, relates to a ladder display device that enables easier circuit generation by using a touch panel.

2. Description of the Related Art

Ladder programs are known as one of the programs used in controlling a processing machine such as a machine tool. A ladder program is configured such that logic circuits (ladder circuits) expressed by symbols such as a node, a coil, or the like are rendered in a ladder shape across two bus lines (a plus bus line and a minus bus line). When editing a ladder program, an edition window of a ladder diagram that renders the ladder program is displayed, and a user operates an input device such as a keyboard or a mouse to perform an editing operation of a ladder circuit on the displayed ladder diagram.

The editing operation of a ladder diagram includes a basic operation such as an operation to newly arrange a node or a coil in a ladder diagram, an operation to form a line between the arranged symbols of the node or the coil or the like. Further, the editing operation also includes a so-called paste operation of a partial circuit or the like to select a part of a ladder diagram (a partial circuit of a ladder) displayed in a window by using a rectangular frame and paste the selected partial circuit to another ladder circuit.

On the other hand, in recent years, touch panels have been used for various devices, and various improvement has been made for an operation method or an edition method. For example, International Publication No. WO2013/073023, International Publication No. WO2013/038541, and International Publication No. WO2015/025382 disclose a technique of editing a ladder diagram in accordance with a gesture operation.

In ladder circuits forming a ladder diagram, there are circuits that are basic elements of a ladder circuit which have somewhat predefined structure, such as a self-holding circuit, a flip-flop circuit, or the like. When inserting such a circuit into a ladder diagram, the user will select a circuit from a menu or an icon and specify a position at which the selected circuit is inserted into the ladder diagram. In performing such insertion, it is necessary to perform a complex operation such as inputting addresses one by one to the inserted ladder circuits, adding a line for a connection to another circuit, or the like.

Accordingly, there is a demand for a ladder display device that enables insertion of a circuit of predefined structure into a ladder diagram with a simple operation.

SUMMARY OF THE INVENTION

A ladder display device according to one aspect of the present disclosure solves the above problem by generating a circuit whose address or the like has been set based on a predefined rule when a user performs a gesture operation which satisfies a predetermined condition on a displayed ladder diagram.

Further, the disclosure according to claim 1 of the present disclosure is a ladder display device in which a ladder program is edited by a gesture operation performed on a touch panel on which the ladder program is displayed in a form of a ladder diagram, and the ladder display device includes: a ladder circuit storage unit that stores an insertion condition including at least an operation start position of the gesture operation, an operation end position of the gesture operation, and a circuit state of a net on the ladder diagram related to the gesture operation as insertion target ladder circuit information in association with a ladder circuit that is an insertion target; a ladder circuit condition determination unit that, with reference to the ladder circuit storage unit, determines a ladder circuit whose insertion condition is satisfied by a gesture operation performed on the touch panel; a ladder circuit generation unit that generates a ladder circuit determined by the ladder circuit condition determination unit as the gesture operation satisfying an insertion condition; and an edition control unit that inserts a ladder circuit generated by the ladder circuit generation unit into the ladder program.

According to one aspect of the present disclosure, the user is able to add a frequently used basic circuit to a ladder diagram by an intuitive and simple operation while making use of original components of a ladder circuit. Thus, a burden on the user is reduced, and an easier operation is enabled.

BRIEF DESCRIPTION OF THE DRAWINGS

The object and the feature of the present disclosure will be apparent from description of the following embodiments with reference to the attached drawings, in which.

DETAILED DESCRIPTION OF THE PREFERRED EMBODIMENTS

Embodiments of the present disclosure will be described below with reference to the drawings.

Figure 1:
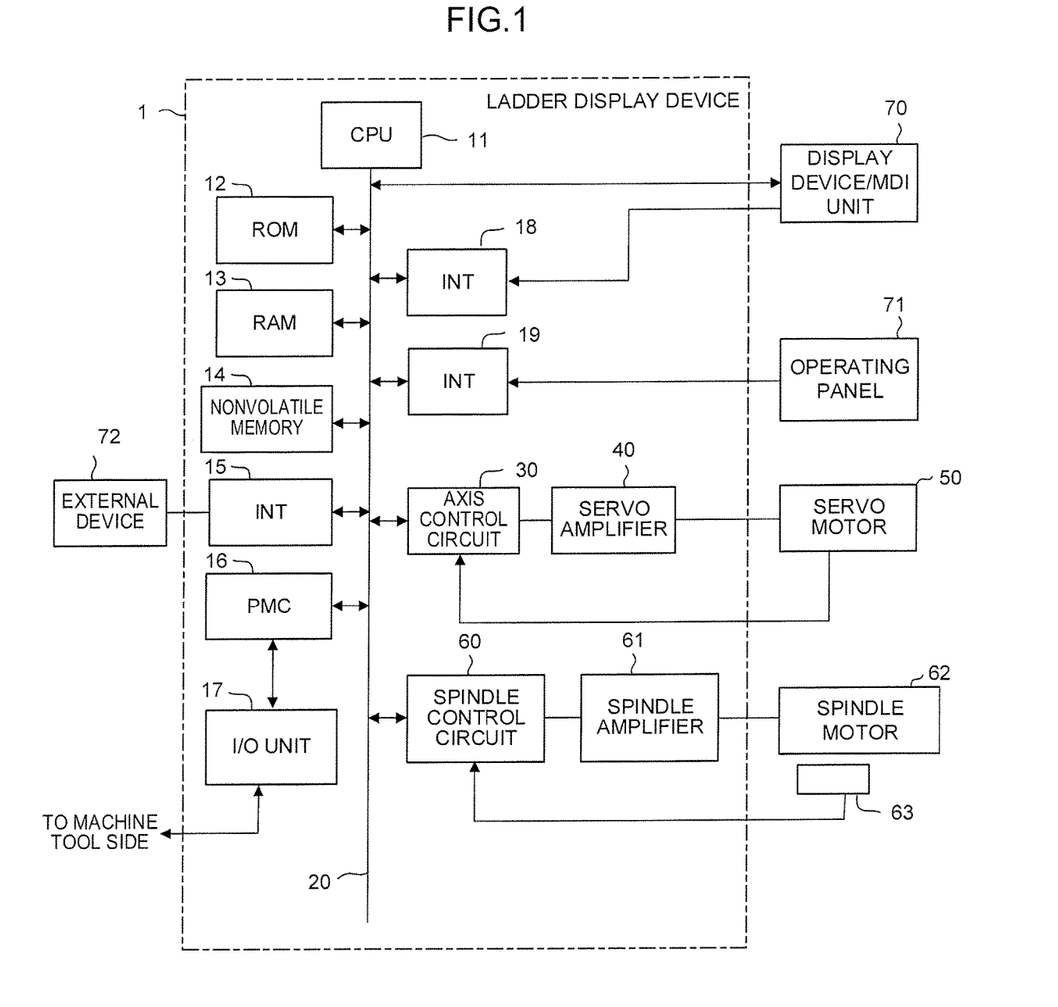
FIG. 1 is a hardware configuration diagram illustrating a ladder display device according to one embodiment.

FIG. 1 is a schematic hardware configuration diagram illustrating a ladder display device according to one embodiment of the present disclosure. A ladder display device 1 of the present disclosure is implemented as a control device that controls an industry machine such as a machine tool based on a ladder program, for example. Further, the ladder display device 1 of the present disclosure is implemented in a computer such as a personal computer provided together with the control device, for example. In the present embodiment, an example in which the ladder display device 1 is implemented in a control device that controls a machine tool based on a ladder program will be illustrated.

A central processing unit (CPU) 11 provided in the ladder display device 1 according to the present embodiment is a processor that controls the ladder display device 1 as a whole. The CPU 11 reads a system program stored in a read only memory (ROM) 12 via a bus 20 and controls the overall ladder display device 1 in accordance with the system program. In a random access memory (RAM) 13, calculation data or display data and externally input various data or the like are temporarily stored.

A nonvolatile memory 14 is formed of a memory device, a solid state drive (SSD), or the like backed up by a battery (not illustrated), for example. The storage state of the nonvolatile memory 14 is maintained even if the ladder display device 1 is powered off. The nonvolatile memory 14 stores a numerical control (NC) program or a ladder program read from an external device 72 via an interface 15. Further, the nonvolatile memory 14 stores an NC program, a ladder program, or the like input via a display device/MDI unit 70. When performed or used, each program or each data stored in the nonvolatile memory 14 may be loaded to the RAM 13. Further, a system program such as a known analysis program or the like is written in advance in the ROM 12.

The interface ("INT") 15 is an interface used for connecting CPU 11 of the ladder display 1 and the external device 72 such as a universal bus (USB) device to each other. An NC program, a ladder program, various parameters, and the like used for controlling a machine tool are read from the external device 72 side. Further, an NC program, a ladder program, various parameters, and the like edited in the ladder display device 1 may be stored in an external storage unit via the external device 72. A programmable machine controller (PMC) 16 executes a ladder program to output a signal to a machine tool and a peripheral device of the machine tool (for example, a turret, an actuator such as a robot, a sensor attached to a machine tool, or the like) via an I/O unit 17 and control the machine tool and the peripheral device. Further, the PMC 16 receives a signal from various switches on an operating panel equipped to a main body of a machine tool, a peripheral device, or the like, performs required signal processing thereon, and then passes the processed signal to the CPU 11.

The display device/MDI unit 70 is a manual data input device including a display, a keyboard, or the like having a function of a touch panel. An interface ("INT") 18 receives an input signal from a keyboard or a touch panel of the display device/MDI unit 70 and passes the received input signal to the CPU 11. An interface ("INT") 19 is connected to an operating panel 71 including a manual pulse generator or the like used when manually driving each axis, for example.

An axis control circuit 30 used for controlling an axis provided in a machine tool receives an instruction from the CPU 11 related to a motion amount of the axis and outputs an instruction for the axis to a servo amplifier 40. The servo amplifier 40 receives such an instruction and drives a servo motor 50 that moves an axis provided in a machine tool. The servo motor 50 has a built-in position/speed detector. The servo motor 50 feeds a position/speed feedback signal from the position/speed detector back to the axis control circuit 30 to perform feedback control of the position/speed. Note that, although the hardware configuration diagram of FIG. 1 illustrates only a single axis control circuit 30, a single servo amplifier 40, and a single servo motor 50, each of these components is provided for the number of axes provided in a machine tool to be controlled in the actual implementation.

A spindle control circuit 60 receives a spindle rotation instruction and outputs a spindle speed signal to a spindle amplifier 61. The spindle amplifier 61 receives the spindle speed signal and rotates the spindle motor 62 of a machine tool at the instructed rotational rate to drive a tool. A position coder 63 is coupled to the spindle motor 62. The position coder 63 outputs feedback pulses in synchronization with rotation of a spindle, and the feedback pulses are read by the CPU 11.

Figure 2:
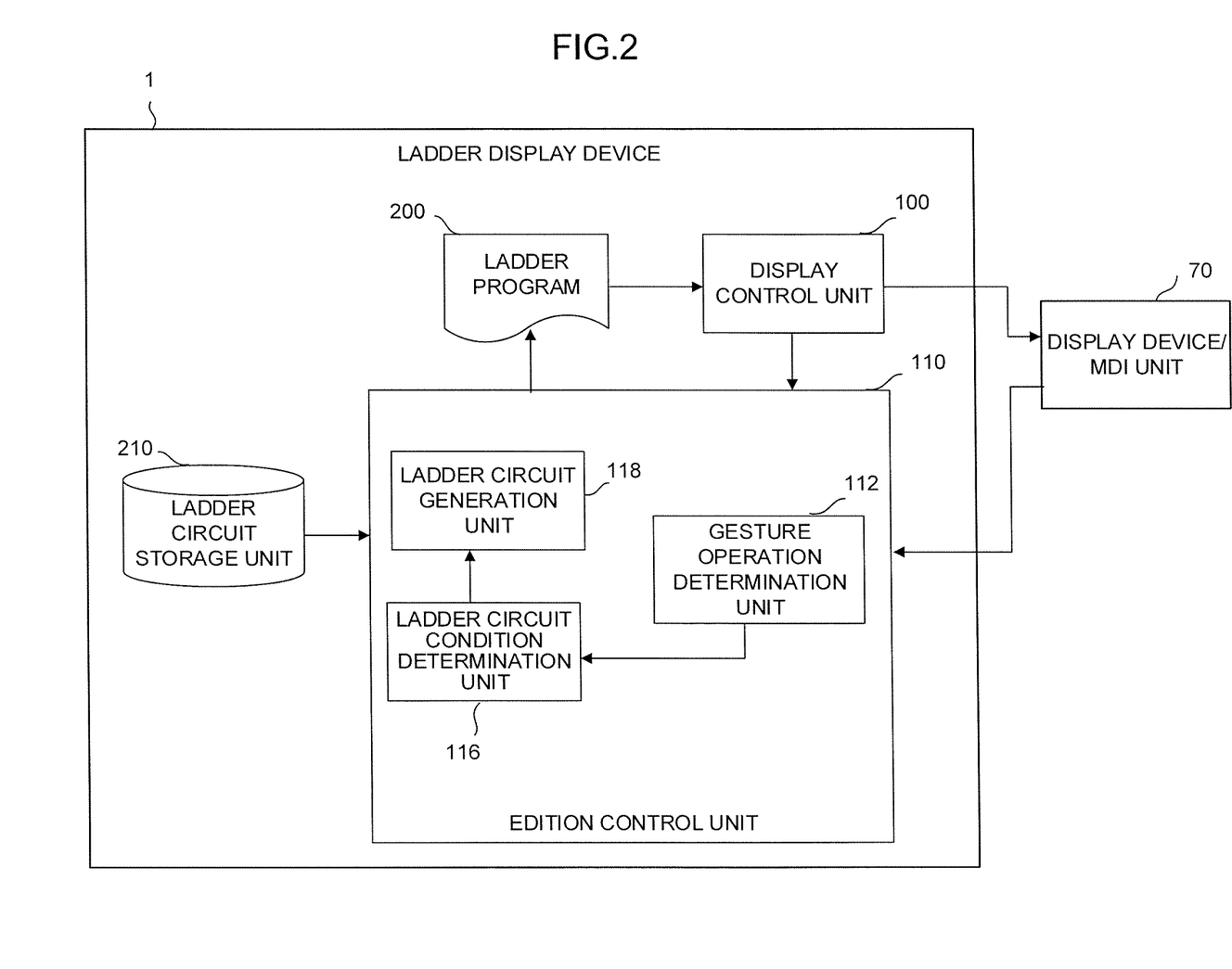
FIG. 2 is a schematic function block diagram of a ladder display device according to a first embodiment.

FIG. 2 is a schematic function block diagram of the ladder display device 1 according to a first embodiment of the present disclosure. Each function of the function block illustrated in FIG. 2 is implemented when the CPU 11 provided in the ladder display device 1 illustrated in FIG. 1 executes a system program to control the operation of each component of the ladder display device 1.

The ladder display device 1 of the present embodiment has a display control unit 100 and an edition control unit 110. Further, the edition control unit 110 includes a gesture operation determination unit 112, a ladder circuit condition determination unit 116, and a ladder circuit generation unit 118. Furthermore, a ladder program 200 to be displayed is pre-stored on the nonvolatile memory 14 of the ladder display device 1 of the present embodiment. Further, a ladder circuit storage unit 210 is provided in the nonvolatile memory 14. The ladder circuit storage unit 210 stores information related to a ladder circuit inserted into the ladder program 200 based on a gesture operation.

The display control unit 100 is implemented when the CPU 11 executes a system program read from the ROM 12. The CPU 11 performs a calculation process and display control on the display device/MDI unit 70 using the RAM 13 and the nonvolatile memory 14 by executing the system program. The display control unit 100 performs control to read the ladder program 200 to be displayed from the nonvolatile memory 14 and display the read ladder program 200 on the display device/MDI unit 70. The display control unit 100 manages a virtual rendering region displayed on the display device/MDI unit 70 on a memory device such as the RAM 13. The display control unit 100 performs control to create a ladder diagram in which an element of a ladder circuit (a node, a coil, a connection line, or the like) included in the ladder program 200 is arranged in the virtual rendering region and display the created ladder diagram on the display device/MDI unit 70. The display control unit 100 may display a cursor, a menu, an icon, or the like which are typical and required for edition of the ladder program 200. Further, in response to a user operation to the display device/MDI unit 70, display control related to a display effect commonly used in graphical user interface, such as emphasis display of a display element, transfer of a display element, deletion of a display element, or the like, may be performed.

The edition control unit 110 is implemented when the CPU 11 executes the system program read from the ROM 12. The CPU 11 performs a calculation process and input control related to the display device/MDI unit 70 using the RAM 13 and the nonvolatile memory 14 by executing the system program. The edition control unit 110 detects a user operation performed on the display device/MDI unit 70 and controls an edition process on the ladder program 200. The edition control unit 110 detects an operation performed on each element, a menu, an icon, and the like forming a ladder diagram displayed on the display device/MDI unit 70 and a user operation input from a keyboard. Based on the detected user operation, the edition control unit 110 then performs, on the ladder program 200, an edition process generally performed in edition of a ladder program, such as insertion, deletion, transfer, copy, address setting, and the like of an element of a ladder circuit. The edition control unit 110 reflects a result of an edition process to the ladder program 200. The edition control unit 110 performs an insertion determination process of a ladder circuit on the ladder program 200 based on information related to the ladder circuit that is an insertion target stored in the ladder circuit storage unit 210 when it is determined by the gesture operation determination unit 112 that a predetermined gesture operation is performed on the touch panel of the display device/MDI unit 70.

The gesture operation determination unit 112 analyzes a user operation performed on the touch panel of the display device/MDI unit 70 to determine whether or not a predetermined gesture operation is performed. The gesture operation determination unit 112 determines whether or not a gesture operation whose operation start position and operation end position can be identified, such as a slide operation (a drag operation), a tap operation performed successively on different positions on the touch panel, or the like is performed. The gesture operation determination unit 112 may perform the determination by identifying whether a gesture operation is performed by touch on one point or performed by multi-touch on two or more points. Further, the gesture operation determination unit 112 may determine whether or not an operation of double taps or the like is performed at the start of the operation.

When it is determined by the gesture operation determination unit 112 that a gesture operation is performed, the ladder circuit condition determination unit 116 determines whether or not the gesture operation satisfies an insertion condition for a predetermined ladder circuit. The ladder circuit condition determination unit 116 performs determination regarding insertion of a ladder circuit based on an insertion condition stored in the ladder circuit storage unit 210 in association with a ladder circuit that is an insertion target. The insertion condition for a ladder circuit includes at least conditions for an operation start position, an operation end position, and a circuit state in a net related to an operation. The insertion condition for a ladder circuit may include a condition that specifies the direction of an operation end position relative to an operation start position.

The insertion condition for an operation start position may be a condition that specifies an element forming a ladder circuit, such as a node, a coil, a connection line, or the like. Further, the insertion condition for an operation start position may include information related to whether or not an address has been set for an element forming a ladder circuit (with address, without address, either will do, or the like).

The insertion condition for an operation end position may be a condition that specifies a positional relationship between a net including an element at an operation start position and a net including the operation end position, such as the same net as a net including an element at the operation start position, a different net from a net including an element at the operation start position, or the like. Further, the insertion condition for an operation end position may be a condition including specification of a position on a net, such as a position near a start point of a net, a position near an end point of a net, or the like. Furthermore, the insertion condition for an operation end position may be a condition including specification of a positional relationship between the operation end position and a component of a ladder circuit in a net at the operation end position.

The insertion condition for a ladder circuit state of a net related to an operation includes at least specification of a ladder circuit state in a net at an operation start position. The insertion condition for a ladder circuit state of a net related to an operation may further include specification of a ladder circuit state at an operation end position. The insertion condition for a ladder circuit state of a net may be a condition that specifies conditions for the type of elements of a ladder circuit arranged in the net and the number of elements of each type. Further, the ladder circuit state of a net may include information related to whether or not an address has been set for each element forming a ladder circuit (with address, without address, either will do, or the like).

When it is determined by the ladder circuit condition determination unit 116 that the gesture operation satisfies the insertion condition of a ladder circuit, the ladder circuit generation unit 118 generates a ladder circuit that is an insertion target by using information on the element of the ladder circuit related to the gesture operation. The ladder circuit generation unit 118 generates, as a ladder circuit that is an insertion target, a ladder circuit associated with an insertion condition of a ladder circuit stored in the ladder circuit storage unit 210. The ladder circuit generation unit 118 sets an address of each element (a node, a coil, or the like) forming the generated ladder circuit based on an address set for an element at an operation start position of a gesture operation, an address set for another element in a net at the operation start position, an address set for an element at an operation end position, an address set for another element in a net at the operation end position, or the like.

The edition control unit 110 then inserts the ladder circuit generated by the ladder circuit generation unit 118 into the ladder program 200.

Figure 3:
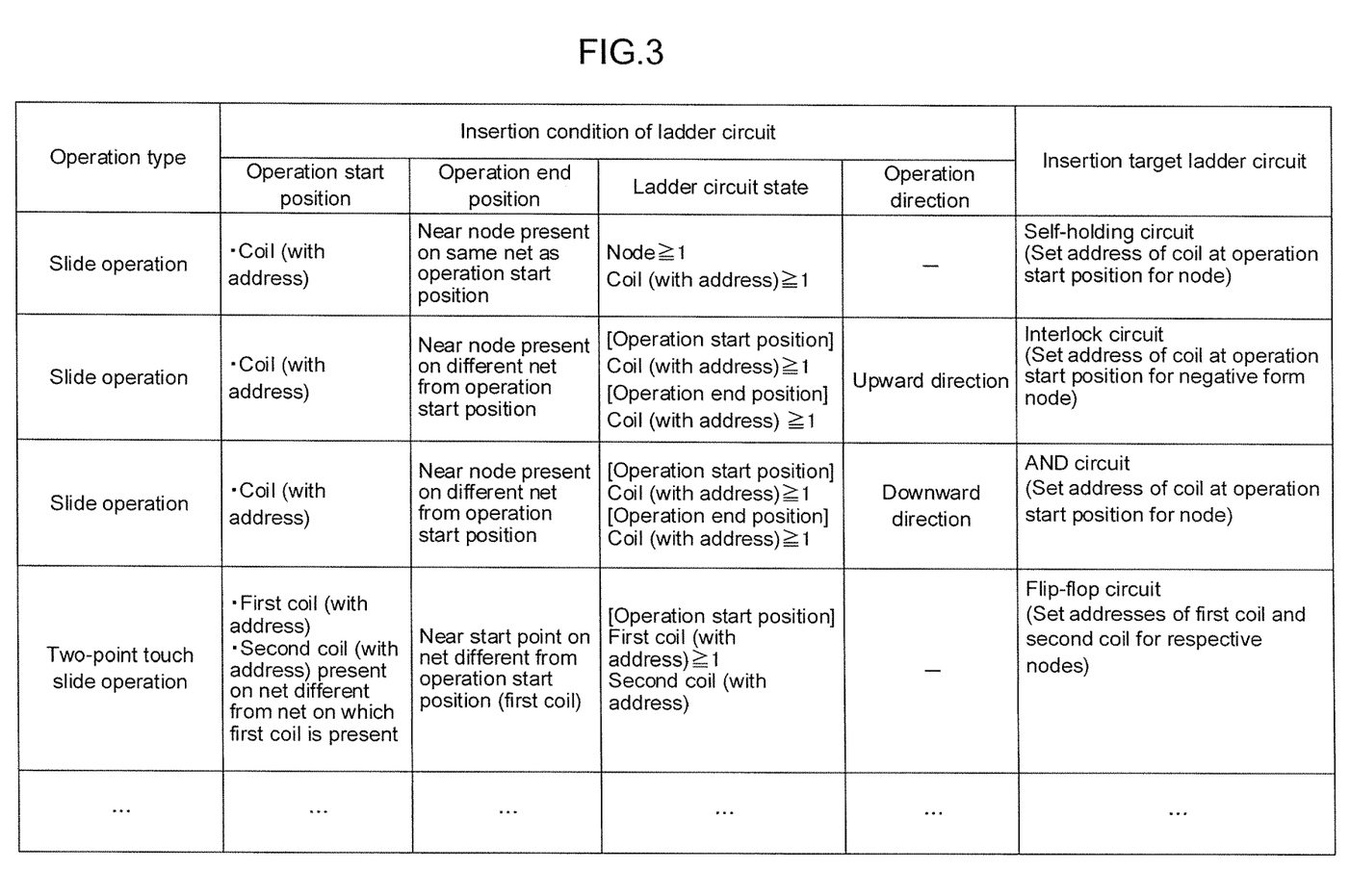
FIG. 3 is a diagram illustrating information related to a ladder circuit that is an insertion target stored in a ladder circuit storage unit as an example.

FIG. 3 illustrates information related to a ladder circuit that is an insertion target stored in the ladder circuit storage unit 210 as an example. FIG. 3 illustrates an example in which types of gesture operations and insertion conditions for a ladder circuit are associated with a ladder circuit of predetermined structure such as a self-holding circuit, an interlock circuit, an AND circuit, a flip-flop circuit, or the like.

Figure 4:
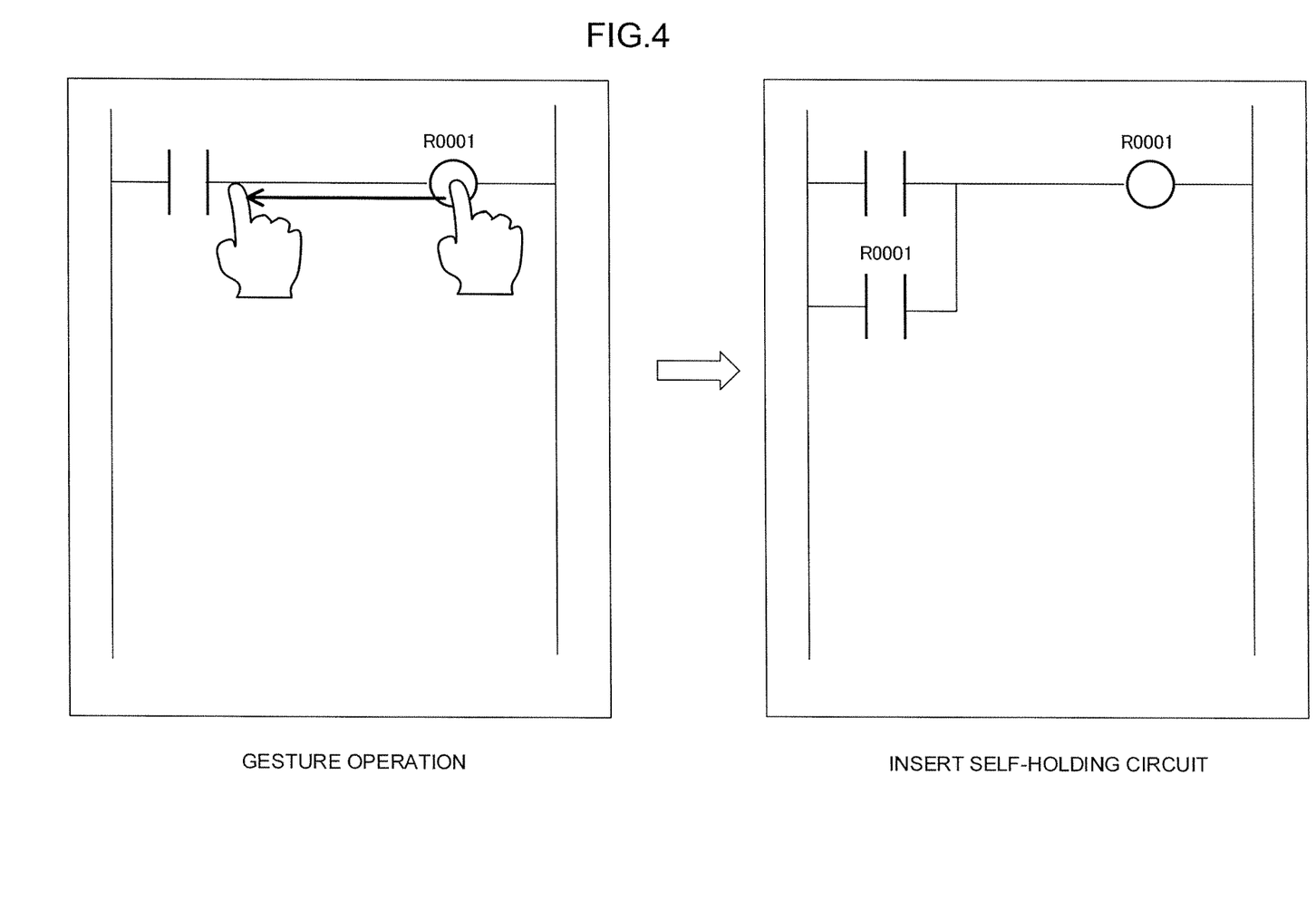
FIG. 4 is a diagram illustrating an example of an insertion operation of a self-holding circuit according to the present disclosure.

FIG. 4 illustrates an example of a gesture operation to insert a self-holding circuit into the ladder program 200. In the example of FIG. 4, a particular coil for which an address has been set is touched on a net in a ladder diagram into which a self-holding circuit is to be inserted. Next, a slide operation is performed in a direction to a node on the same net, and the finger is removed near the node. With such a gesture operation, a node for which the same address as the address of the coil corresponding to the operation start position has been set is inserted in parallel to the node near the operation end position. With such a simple gesture operation, a self-holding circuit for which an address has been set is inserted into the net being operated.

Figure 5:
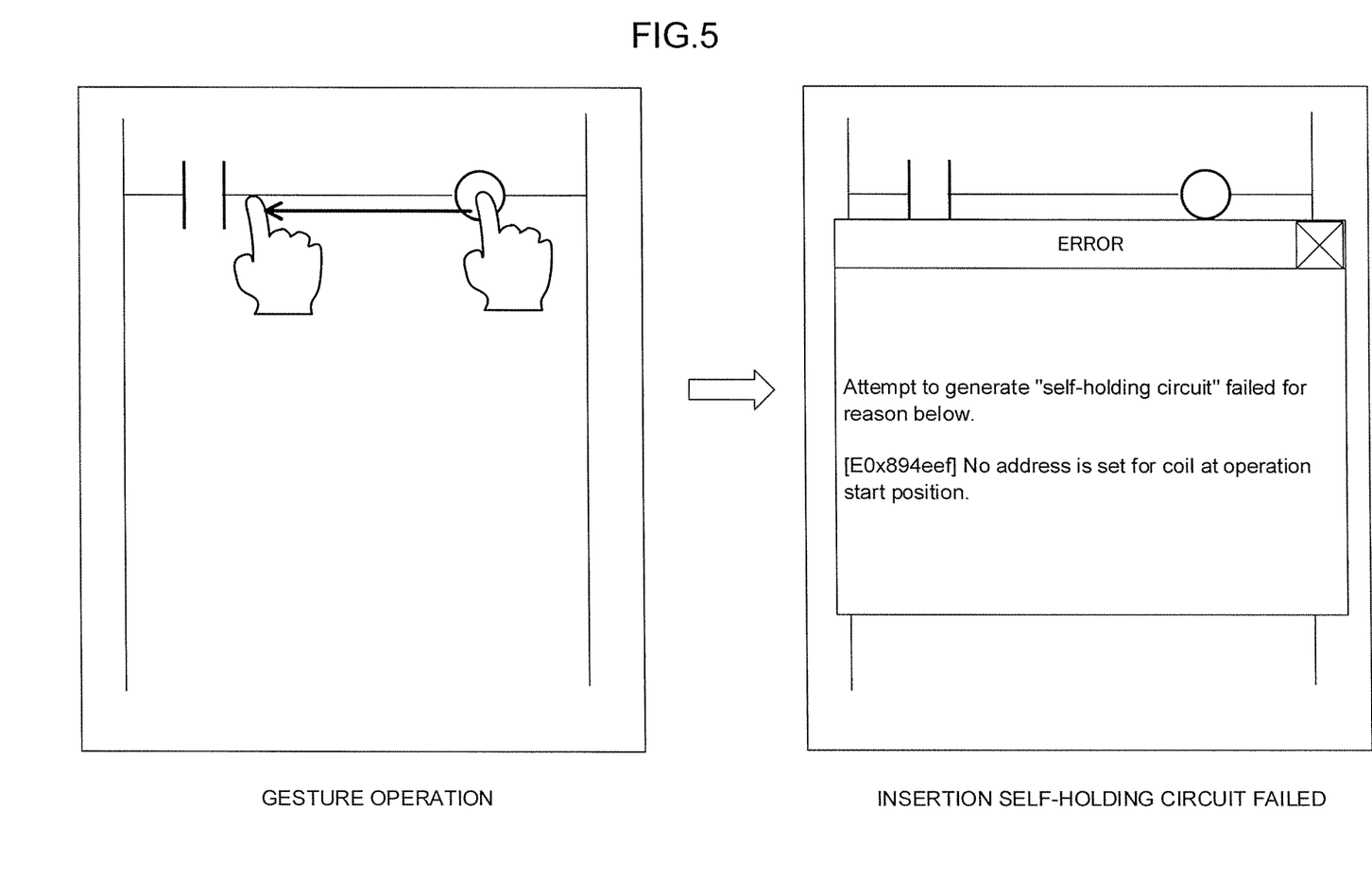
FIG. 5 is a diagram illustrating an example in which an insertion operation of a self-holding circuit fails according to the present disclosure.

FIG. 5 illustrates an example in which a gesture operation to insert a self-holding circuit into the ladder program 200 fails. In the example of FIG. 5, a particular coil for which no address has been set is touched on a net in a ladder diagram into which a self-holding circuit is to be inserted, and a slide operation is performed in a direction to a node on the same net. No object for which the insertion condition corresponding to this operation has been set exists in information related to the ladder circuit that is the insertion target stored in the ladder circuit storage unit 210. Such a case may be handled as a normal editing operation without performing any insertion operation due to the gesture operation. Further, when information related to a ladder circuit for which an insertion condition similar to that for the operation described above (for example, an insertion condition where one condition does not match the content of a gesture operation) has been set is present in the ladder circuit storage unit 210, an error window may be displayed based on information related to the ladder circuit for which the similar insertion condition has been set, as illustrated in FIG. 5 as an example.

Figure 6:
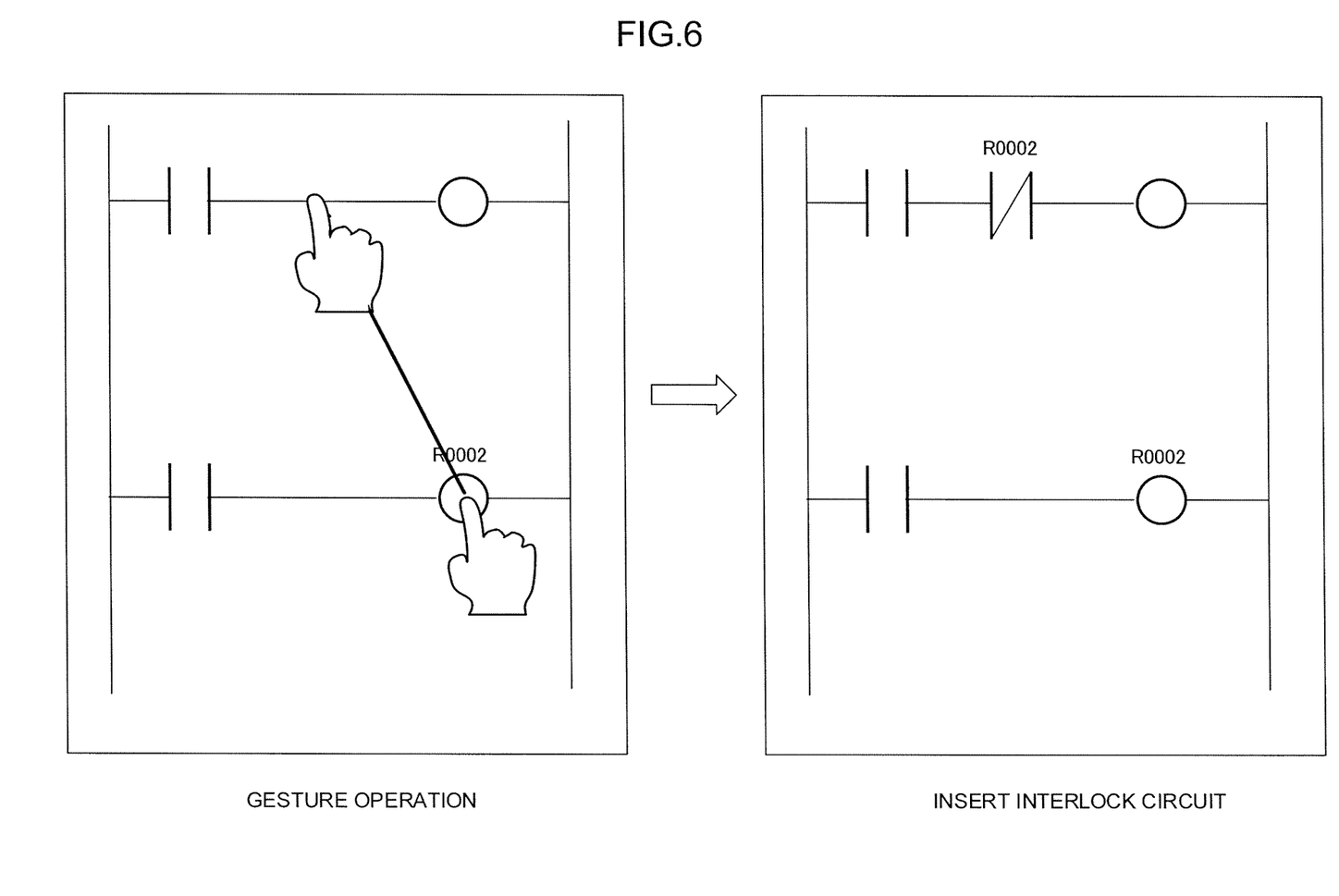
FIG. 6 is a diagram illustrating an example of an insertion operation of an interlock circuit according to the present disclosure.

FIG. 6 illustrates an example of a gesture operation to insert an interlock circuit into the ladder program 200. In the example of FIG. 6, a particular coil for which an address has been set is touched in a ladder diagram. Next, a slide operation is performed toward an area near a node on a different net located above the net having the coil, and the finger is removed near the node. With such a gesture operation, a negative form node for which the same address as the address of the coil corresponding to the operation start position is set is inserted in series to the node near the operation end position. With such a simple gesture operation, an interlock circuit for which an address has been set is inserted into the net being operated.

Figure 7:
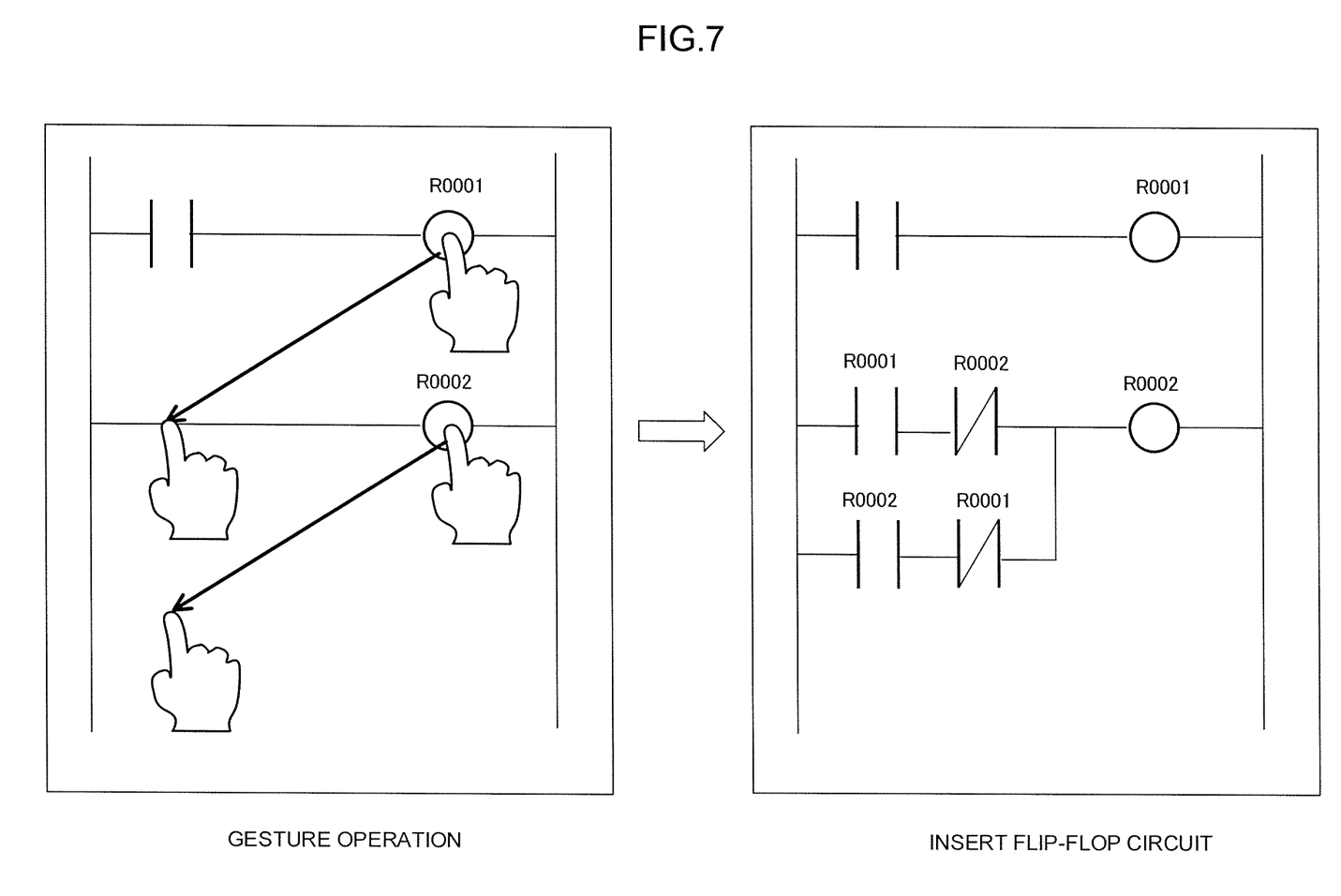
FIG. 7 is a diagram illustrating an example of an insertion operation of a flip-flop circuit according to the present disclosure.

FIG. 7 illustrates an example of a gesture operation to insert a flip-flop circuit into the ladder program 200. In the example of FIG. 7, two particular coils (a first coil and a second coil) for which addresses have been set are multi-touched (two points are touched) in a ladder diagram. Next, a slide operation is performed toward areas near start points of nets different from the net having the first coil, and the fingers are removed. With such a gesture operation, a flip-flop circuit with addresses of respective coils corresponding to operation start positions is inserted in the operation end positions. With such a simple gesture operation, a flip-flop circuit for which an address has been set is inserted into the net being operated.

In the ladder display device 1 according to the present embodiment having the configuration described above, the user is able to add a frequently used basic circuit to a ladder diagram by performing an intuitive and simple operation while making use of original components of a ladder circuit. Thus, a burden on the user is reduced, and an easier operation is enabled. In particular, as described in FIG. 4 to FIG. 7 or the like, in determination of a gesture operation for insertion of a ladder circuit in the present disclosure, by using information on a circuit state of a net at an operation start position or the like, it is possible to prevent a ladder circuit from being inserted due to an erroneous operation. Further, it is possible to perform insertion of a ladder circuit based on various conditions for each structure of a ladder circuit by performing an intuitive operation.

Figure 8:
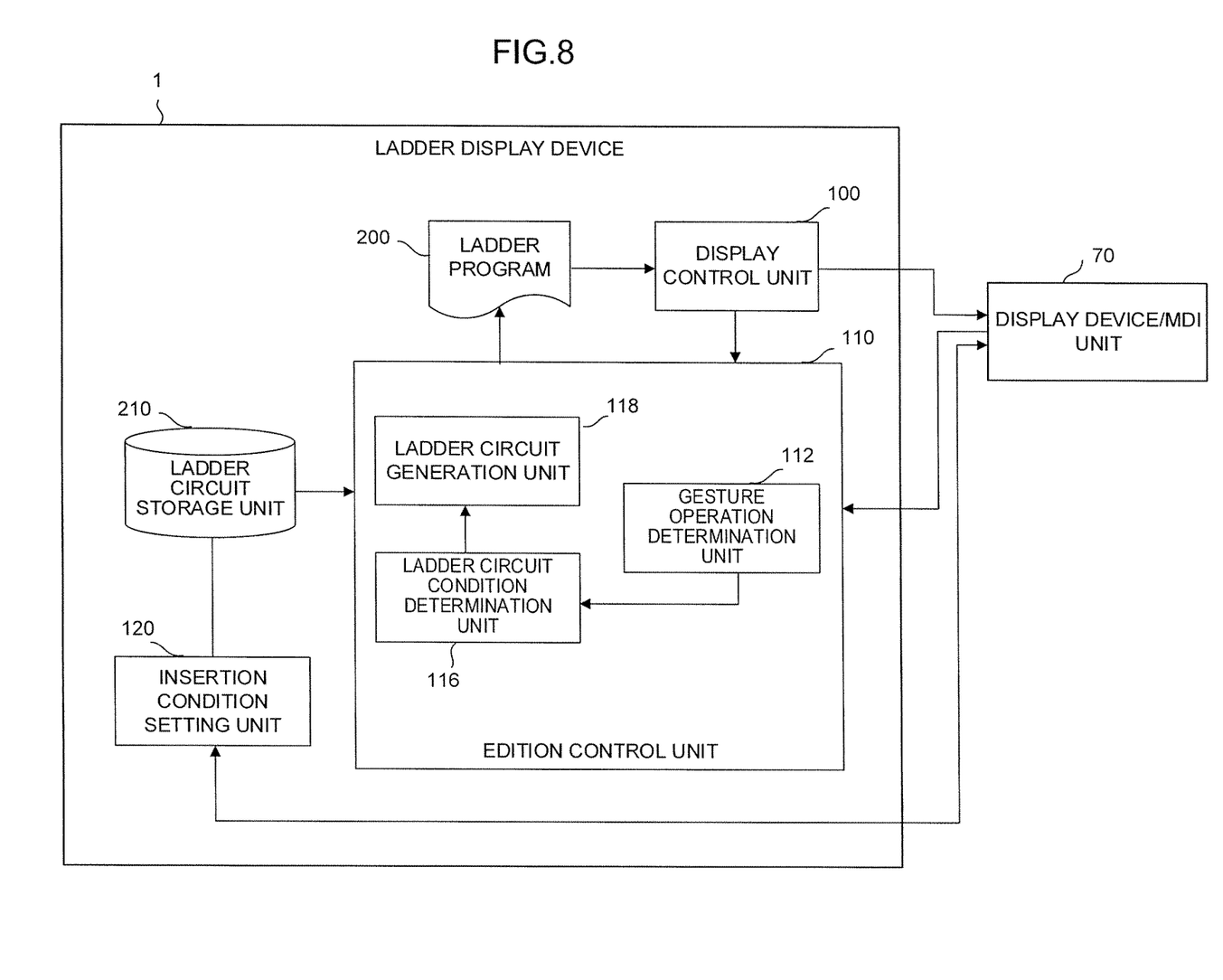
FIG. 8 is a schematic function block diagram of a ladder display device according to a second embodiment.

FIG. 8 is a schematic function block diagram of the ladder display device 1 according to a second embodiment of the present disclosure. Each function of the function blocks illustrated in FIG. 8 is implemented when the CPU 11 provided in the ladder display device 1 illustrated in FIG. 1 executes a system program and controls the operation of each component of the ladder display device 1.

The ladder display device 1 of the present embodiment includes the display control unit 100, the edition control unit 110, the gesture operation determination unit 112, the ladder circuit condition determination unit 116, and the ladder circuit generation unit 118 described in the first embodiment. The ladder display device 1 of the present embodiment further includes an insertion condition setting unit 120. Further, the ladder program 200 to be displayed is pre-stored on the nonvolatile memory 14 of the ladder display device 1 of the present embodiment. Further, the ladder circuit storage unit 210 that stores information related to a ladder circuit, which is an insertion target, to be inserted into the ladder program 200 based on a gesture operation is provided on the nonvolatile memory 14.

The display control unit 100, the edition control unit 110, the gesture operation determination unit 112, the ladder circuit condition determination unit 116, and the ladder circuit generation unit 118 according to the present embodiment have the same functions as the display control unit 100, the edition control unit 110, the gesture operation determination unit 112, the ladder circuit condition determination unit 116, and the ladder circuit generation unit 118 described in the first embodiment, respectively.

The insertion condition setting unit 120 is implemented when the CPU 11 provided in the ladder display device 1 illustrated in FIG. 1 executes the system program read from the ROM 12. The CPU 11 performs a calculation process, display control on the display device/MDI unit 70, and input control related to the display device/MDI unit 70 using the RAM 13 and the nonvolatile memory 14 by executing the system program. The insertion condition setting unit 120 is a function unit by which a user defines a ladder circuit of predetermined structure to be inserted by a gesture operation. For example, the insertion condition setting unit 120 displays a user definition window on the display device/MDI unit 70 and accepts a setting regarding a type of a gesture operation, an insertion condition of a ladder circuit, a configuration of a ladder circuit that is an insertion target, or the like on the user definition window. The insertion condition setting unit 120 stores insertion ladder circuit information created based on the accepted information in the ladder circuit storage unit 210.

Figure 9:
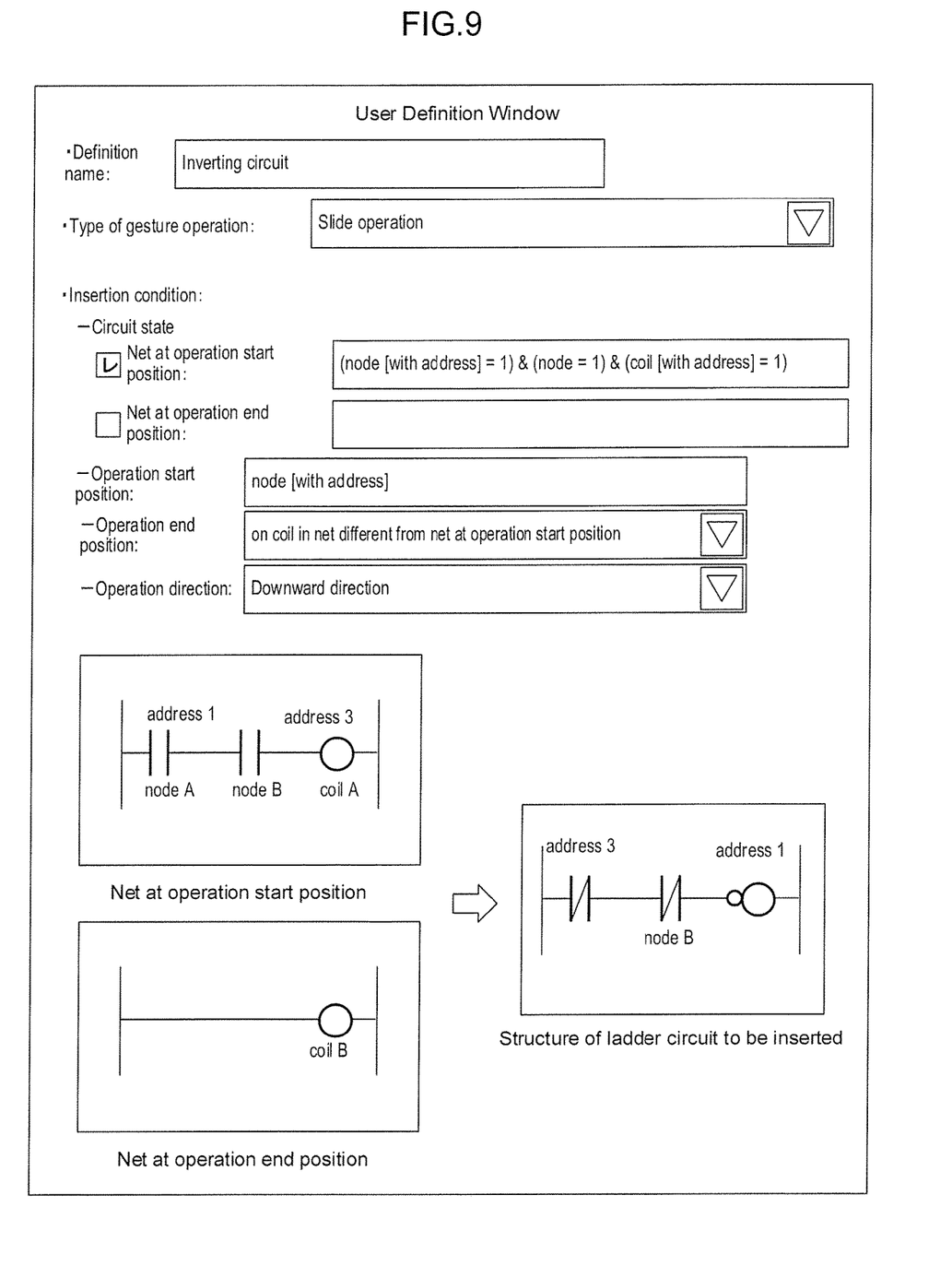
FIG. 9 is a diagram illustrating an example of a user definition window.

FIG. 9 illustrates an example of a user definition window displayed on the display device/MDI unit 70 by the insertion condition setting unit 120. The user definition window is presented on the display device/MDI unit 70 as a window in an entry form format, for example. The user definition window is designed in any manner so that at least a type of a gesture operation, an operation start position, an operation end position, a circuit state of a net at the operation start position, and the structure of a ladder circuit to be inserted included in insertion ladder circuit information can be defined. Further, the user definition window may be further designed so that a circuit state of a net at an operation end position and a direction of a gesture operation can be defined. An item that can be defined in the user definition window may be configured so that an item value can be defined by inputting a text in a textbox such as "definition name" field or "operation start position" field illustrated in FIG. 9, for example. An item value of an item that can be defined in the user definition window may be able to be defined by using a dropdown list as with "gesture operation type" field illustrated in FIG. 9, for example, or using an entry form component used in general such as a checkbox, a radio button, or the like. Further, for the structure of a ladder circuit to be inserted, any configuration may be employed as long as it can be edited by using a general edition function of a ladder circuit. When the structure of a ladder circuit to be inserted is edited, it is preferable to display a ladder diagram of a net at an operation start position and a ladder diagram of a net at an operation end position based on the circuit state of a net at the operation start position, the circuit state of a net at the operation end position, the definition of the operation start position, and the definition of the operation end position. Further, it is preferable to make it possible to perform edition while associating an element of a net at an operation start position and an element of a net at an operation end position with each element included in a ladder circuit to be inserted by performing copy from elements included in a displayed ladder diagram, logical inversion of the copied element, insertion of a new element, and copy of an address.

In the example of FIG. 9, "inverting circuit" is defined as a ladder circuit of predetermined structure to be inserted by a gesture operation. In this example, a slide operation is selected as a type of a gesture operation from a dropdown list. Further, for the circuit state of a net at an operation start position, a circuit state is defined by setting a checkbox. In the example of FIG. 9, a circuit state can be defined by a simple determination formula. For example, a node for which it does not matter whether or not an address is present is simply denoted as "node", a node having an address is denoted as "node [with address]" or the like, and thereby a condition such as the number of nodes or the number of coils included in a net can be defined by a general mathematical formula or a general logical formula. In the example of FIG. 9, it is defined that an insertion condition is satisfied when the net at an operation start position is in a circuit state including one node for which an address has been set, one node for which it does not matter whether or not an address has been set, and one coil for which an address has been set. Note that, for the circuit state of the net at an operation end position, no circuit state is defined without the checkbox being checked. Further, in the example illustrated in FIG. 9, the operation start position of a gesture operation (a slide operation) is defined as a node for which an address has been set. The operation end position is defined as an area on a coil of a net different from the net at the operation start position. The operation direction is defined as a downward direction. Further, it is defined that, when such an operation is performed, a ladder circuit in which a negative form node for which an address of a coil in a net at the operation start position has been set, a negative form node other than a node at the operation start position, and a negative form coil for which an address of the node at the operation start position has been set are arranged in series is inserted. The example of FIG. 9 illustrates that the negative form node b having the structure of a ladder circuit to be inserted is a logically inverted node b included in the net at the operation start position. Further, in the structure of a ladder circuit to be inserted, the address of the element before the operation is started is set for a newly inserted element.

Figure 10:
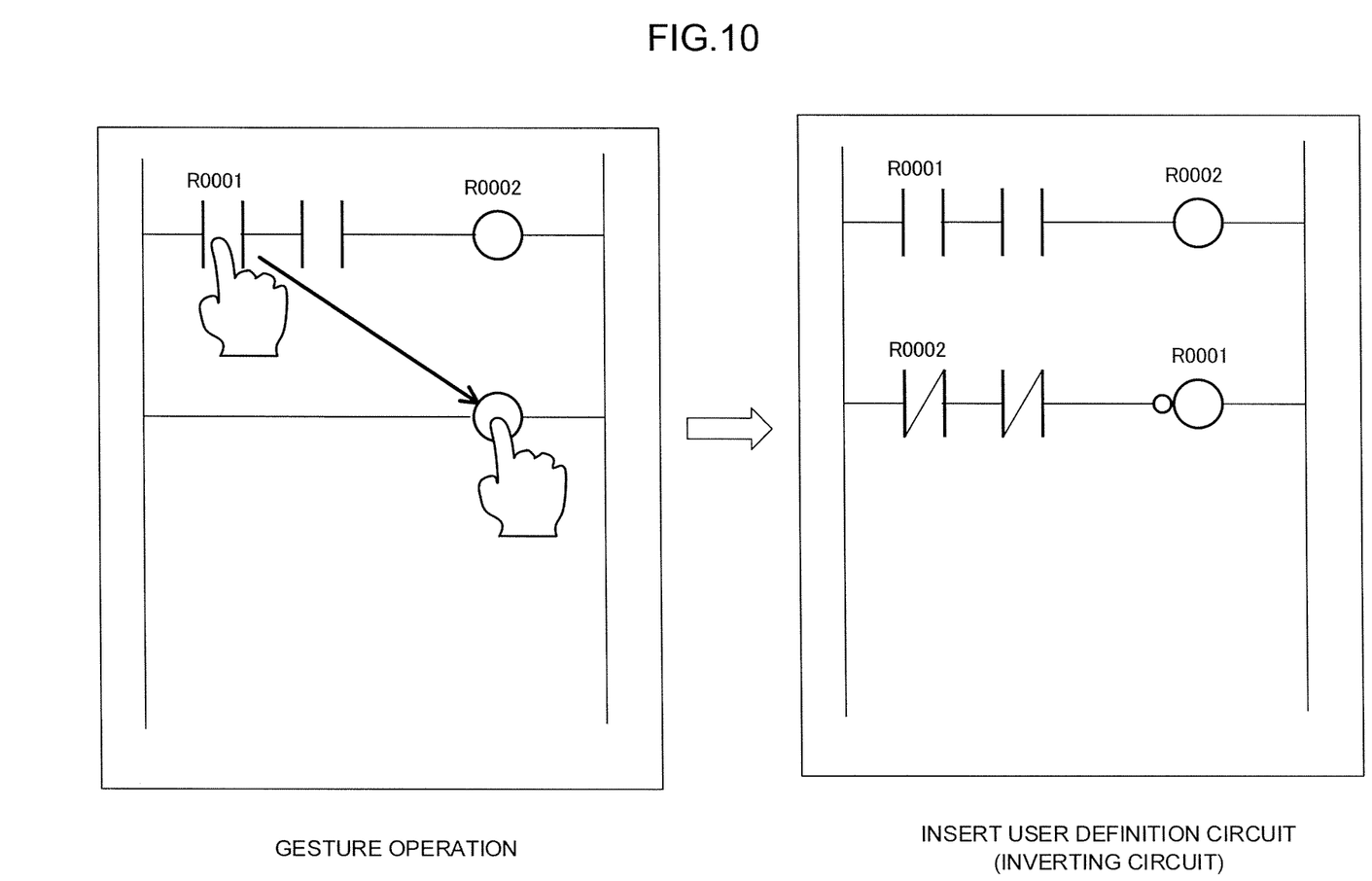
FIG. 10 is diagram illustrating an example of an insertion operation of an inverting circuit defined by a user.

FIG. 10 illustrates an example of a gesture operation of an inverting circuit defined in the example of FIG. 9. In the example of FIG. 10, a particular node for which an address has been set is touched on the ladder diagram. Next, a slide operation is performed toward an area on a coil of a net different from the net including the node, and the finger is removed from the coil. With such a gesture operation, an inverting circuit in which a negative form node for which the address of the coil on the net including the node at the operation start position has been set, a negative form node other than the node at the operation start position, and a negative form coil for which the address of the node at the operation start position has been set are arranged in series is inserted into the net at the operation end position (replaced with the coil at the operation end position).

The ladder display device 1 according to the present embodiment having the configuration described above enables the user to define by himself/herself a ladder circuit of predetermined structure to be inserted by a gesture operation and add the circuit of the predetermined structure, which is frequently used by the user, to a ladder diagram with a simple operation.

Although the embodiments of the present disclosure have been described above, the present disclosure is not limited to only the examples in the embodiments described above and can be implemented in various forms by adding appropriate modification.

For example, although the example in which an insertion condition is defined by using a determination equation or a text in the user definition of a ladder circuit of predetermined structure to be inserted by a gesture operation in the above embodiments has been illustrated, other definition methods such as a method of using interface by which a circuit state can be graphically defined may be employed, for example.

The invention claimed is:

1. A ladder display device in which a ladder program is edited by a gesture operation performed on a touch panel on which the ladder program is displayed in a form of a ladder diagram, the ladder display device comprising a processor to implement:
   a ladder circuit storage unit that stores an insertion condition including at least an operation start position of the gesture operation, an operation end position of the gesture operation, and a circuit state of a net on the ladder diagram related to the gesture operation as insertion target ladder circuit information in association with a ladder circuit that is an insertion target, wherein the circuit state of the net specifies conditions for a type of elements of the ladder circuit arranged in the net, a number of elements of each type, or whether an address has been set for each element forming the ladder circuit;
   a ladder circuit condition determination unit that, with reference to the ladder circuit storage unit, determines a ladder circuit whose insertion condition is satisfied by the gesture operation performed on the touch panel;
   a ladder circuit generation unit that generates the ladder circuit determined by the ladder circuit condition determination unit as the gesture operation satisfying an insertion condition; and
   an edition control unit that inserts the ladder circuit generated by the ladder circuit generation unit into the ladder program.

2. The ladder display device according to claim 1, wherein based on a circuit state of a net on the ladder diagram related to the gesture operation, the ladder circuit generation unit generates a ladder circuit including an element for which a predetermined address is set.

3. The ladder display device according to claim 1 further comprising an insertion condition definition unit that defines insertion target ladder circuit information based on a user operation and stores the defined insertion target ladder circuit information in the ladder circuit storage unit.

4. The ladder display device according to claim 1, wherein the insertion condition further includes an operation direction in addition to the operation start position of the gesture operation, the operation end position of the gesture operation, and the circuit state of the net on the ladder diagram related to the gesture operation.

* * * * *